United States Patent
Hsu

(10) Patent No.: US 9,407,268 B1
(45) Date of Patent: Aug. 2, 2016

(54) LOW VOLTAGE DIFFERENTIAL SIGNALING (LVDS) DRIVER WITH DIFFERENTIAL OUTPUT SIGNAL AMPLITUDE REGULATION

(71) Applicant: Integrated Device Technology, Inc., San Jose, CA (US)

(72) Inventor: John Hsu, Sunnyvale, CA (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 14/700,034

(22) Filed: Apr. 29, 2015

(51) Int. Cl.
*H03K 3/00* (2006.01)
*H03K 19/0185* (2006.01)

(52) U.S. Cl.
CPC ............... *H03K 19/018528* (2013.01)

(58) Field of Classification Search
CPC ............................. H03K 19/018528
See application file for complete search history.

(56) References Cited

U.S. PATENT DOCUMENTS

| | | | |
|---|---|---|---|
| 5,426,383 A | 6/1995 | Kumar et al. | |
| 6,054,881 A | 4/2000 | Stoenner | |
| 6,329,836 B1 | 12/2001 | Drost et al. | |
| 6,836,143 B2 | 12/2004 | Song et al. | |
| 7,385,414 B2 | 6/2008 | Kim et al. | |
| 7,741,866 B2 | 6/2010 | Krishnan et al. | |
| 8,570,063 B2 | 10/2013 | Grunzke et al. | |
| 2002/0053923 A1 | 5/2002 | Kim et al. | |
| 2003/0122593 A1* | 7/2003 | Volk ............. | H04L 25/028 327/108 |
| 2004/0119497 A1 | 6/2004 | Roy et al. | |
| 2006/0066354 A1 | 3/2006 | Isik et al. | |
| 2008/0106301 A1 | 5/2008 | Fukushi | |
| 2010/0033210 A1 | 2/2010 | Baek et al. | |
| 2014/0159769 A1 | 6/2014 | Hong et al. | |

OTHER PUBLICATIONS

"LVDS I/O Interface for Gb/s-per pin Operation in 0.35-um CMOS," IEEE Journal of Solid State Circuits, vol. 36, No. 4, Apr. 2001 by Boni, Pierazzi and Vecchi.

* cited by examiner

*Primary Examiner* — Daniel Puentes
(74) *Attorney, Agent, or Firm* — Glass & Associates; Molly Sauter; Kenneth Glass

(57) ABSTRACT

An low voltage differential signaling (LVDS) driver is provide having an output voltage amplitude regulator for regulating an output voltage amplitude of the LVDS driver by receiving a differential output signal from a switched-polarity current generator of the LVDS driver at an output voltage amplitude regulator of the LVDS driver, detecting an output voltage amplitude of the differential output signal, comparing the output voltage amplitude to a reference voltage at the output voltage amplitude regulator and regulating a steering current of the LVDS driver based upon the comparison between the output voltage amplitude and the reference voltage to regulate an amplitude of the differential output signal at one or more loads of the LVDS driver.

17 Claims, 5 Drawing Sheets

LOW VOLTAGE DIFFERENTIAL SIGNALING (LVDS) DRIVER WITH DIFFERENTIAL OUTPUT SIGNAL AMPLITUDE REGULATION

FIELD OF THE INVENTION

This invention relates to low voltage differential signaling (LVDS) integrated circuits and in particular to a LVDS driver having output voltage amplitude regulation.

BACKGROUND OF THE INVENTION

Low voltage differential signaling (LVDS) is a high-speed digital interface that has become the primary technology for applications that require low power consumption and high noise immunity for high data rates. LVDS is standardized under ANSI/TIA/EAI-644, which provides guidelines that define the electrical characteristics for the LVDS driver output and the receiver input of the LVDS interface.

While LVDS implementations provide significant advantages in applications requiring high data transfer rates, LVDS circuits are not immune to process and environmental conditions. The conditions affecting the LVDS circuits may include process variations (P), power supply voltage variations (V) and operating temperature variations (T), commonly referred to collectively as PVT variations. The steering current provided by the LVDS driver to a load changes as a result of these PVT variations, which directly affects the amplitude of the differential output voltage of the LVDS driver.

Additionally, LVDS circuits are commonly designed to drive a steering current for an individual load. As such, when multiple loads are coupled to a common output of an LVDS driver, the steering current must drive multiple loads, resulting in a undesirable reduction of the amplitude of the differential output voltage of the LVDS driver because the current is divided by the number of loads that are connected to the output.

Accordingly, what is needed in the art is an improved system and method for regulating the amplitude of the output voltage of a low voltage differential signaling (LVDS) driver under varying PVT conditions and under multiple load situations.

SUMMARY

In various embodiments, the invention includes a low voltage differential signaling (LVDS) driver having differential output signal amplitude regulation. As such the differential output voltage provided by the LVDS driver of the present invention is substantially constant over varying process, temperature and supply voltage conditions and under multiple load conditions.

In one embodiment, the invention includes a method of regulating an output voltage amplitude of a low voltage differential signaling (LVDS) driver, which includes receiving a differential output signal from a switched-polarity current generator of an LVDS driver at an output voltage amplitude regulator of the LVDS driver, detecting an output voltage amplitude of the differential output signal, comparing the output voltage amplitude to a reference voltage at the output voltage amplitude regulator and regulating a steering current of the LVDS driver based upon the comparison between the output voltage amplitude and the reference voltage to regulate an amplitude of the differential output signal at one or more loads of the LVDS driver.

In a specific embodiment, the method may further include, detecting a common mode voltage of the differential output signal and subtracting the common mode voltage from the output voltage amplitude before comparing the output voltage amplitude to the reference voltage.

In an additional embodiment, the invention includes a low voltage differential signaling (LVDS) driver coupled to one or more loads, the LVDS driver further comprising, a switched-polarity current generator configured to provide a differential output signal to one or more loads coupled, a common mode voltage regulator configured to regulate the common mode voltage of the switched-polarity current generator, an output voltage amplitude detector configured to detect the output voltage amplitude of the differential output signal from the switched-polarity current generator, an output voltage amplitude comparator configured to compare the output voltage amplitude to the reference voltage, and a steering current regulator configured to regulate the steering current of the LVDS driver based upon the comparison between the output voltage amplitude and the reference voltage to regulate an amplitude of the differential output signal at one or more loads of the LVDS driver.

In a particular embodiment, the LVDS driver may further include a common mode voltage subtractor configured to detect a common mode voltage of the differential output signal and to subtract the common mode voltage from the output voltage amplitude before providing the output voltage amplitude to the output voltage amplitude comparator In accordance with the invention, an improved system and method is provided for regulating the amplitude of the output voltage of a low voltage differential signaling (LVDS) driver under varying PVT conditions and under multiple load situations.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DETAILED DESCRIPTION

The present invention provides a low voltage differential signaling (LVDS) driver having differential output signal amplitude regulation. As such the differential output voltage provided by the LVDS driver of the present invention is substantially constant over varying process, temperature and supply voltage conditions and under multiple load conditions.

Figure 1:
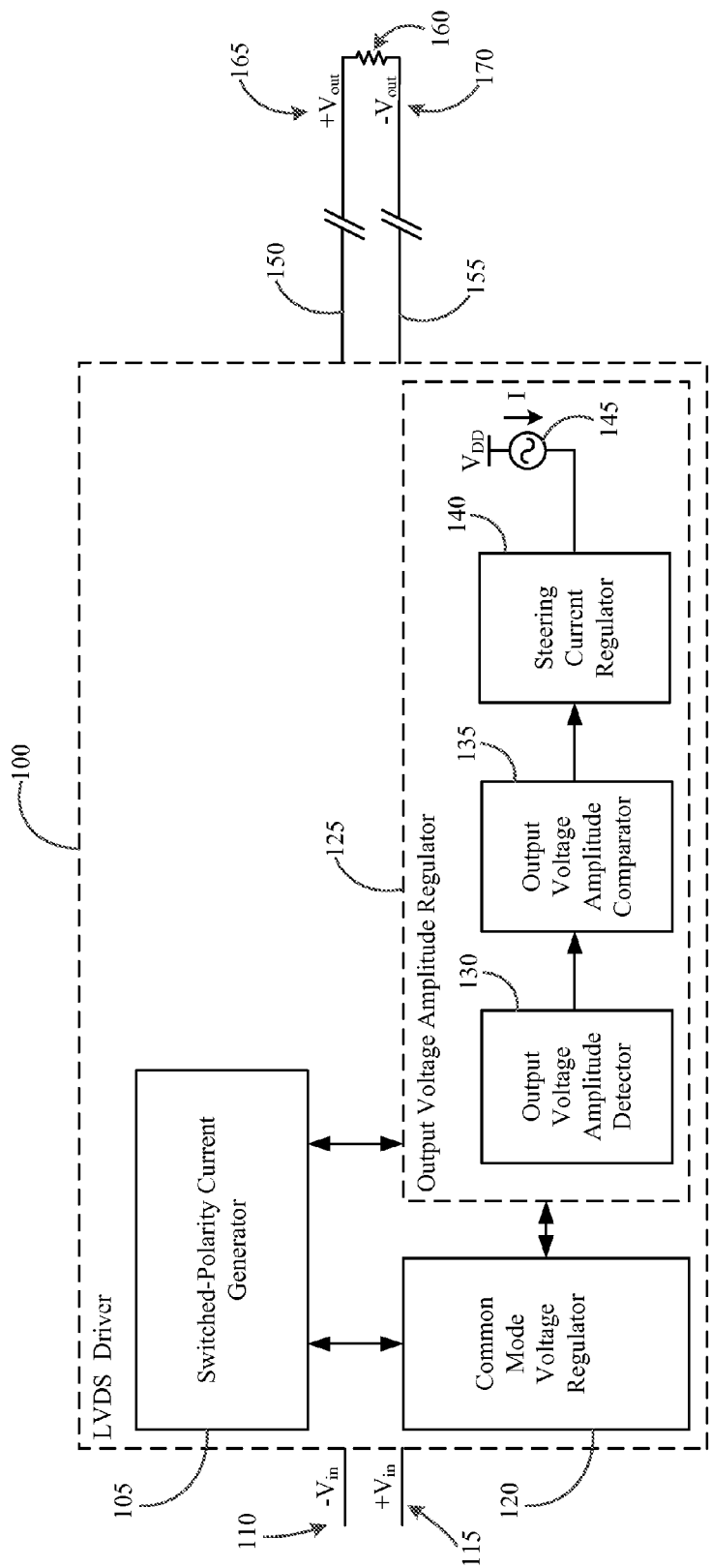
FIG. 1 is a block diagram of an LVDS driver having differential output voltage amplitude regulation, in accordance with an embodiment of the present invention.

With reference to FIG. 1, in accordance with an embodiment of the invention, an LVDS driver 100 includes a switched-polarity current generator 105, a common mode voltage regulator 120 and an output voltage amplitude regulator 125. The switched-polarity current generator 105 of the LVDS driver 100 is configured to receive a differential input signal 110, 115 from a voltage source and to provide a differential output signal 165, 170 through a pair of transmission lines 150, 155 and to a load 160. The switched-polarity current generator 105 behaves as a typical LVDS transmitter by operating to provide a current source with a switched polarity. The output current from the current generator 105 flows through the load resistance 160, thereby establishing the appropriate differential output voltage swing. The common mode voltage regulator 120 is coupled to the switched-polarity current generator 105 and is configured to regulate the common mode voltage of the differential output signal 165, 170. The common mode voltage regulator 120 may be a closed-loop control circuit that provides a feedback bias current to the switched-polarity current generator 105 based upon a reference voltage and an integrated resistor. The output voltage amplitude regulator 125 is coupled to the common mode voltage regulator 120 and to the switched-polarity current generator 105 and is configured to regulate the amplitude of the differential output signal 165, 170 under varying PVT conditions and multiple load conditions.

The output voltage amplitude regulator 125 of the present invention further includes an output voltage amplitude detector 130, an output voltage amplitude comparator 135 and a steering current regulator 140. The output voltage amplitude regulator 125 is configured to receive the differential output signal 165, 170 generated by the switched-polarity current generator 105 and to detect the output voltage amplitude of the differential output signal 165, 170. The output voltage amplitude comparator 130 is coupled to the output voltage amplitude detector 135 and is configured to compare the output voltage amplitude of the differential output signal to a reference voltage. The steering current regulator 140 is coupled to the output voltage amplitude comparator 135 and to the common mode voltage regulator 120 and is configured to regulate the steering current of the LVDS driver 100 based upon the comparison between the output voltage amplitude and the reference voltage, thereby controlling the amplitude of the output voltage across the load 160.

Figure 2:
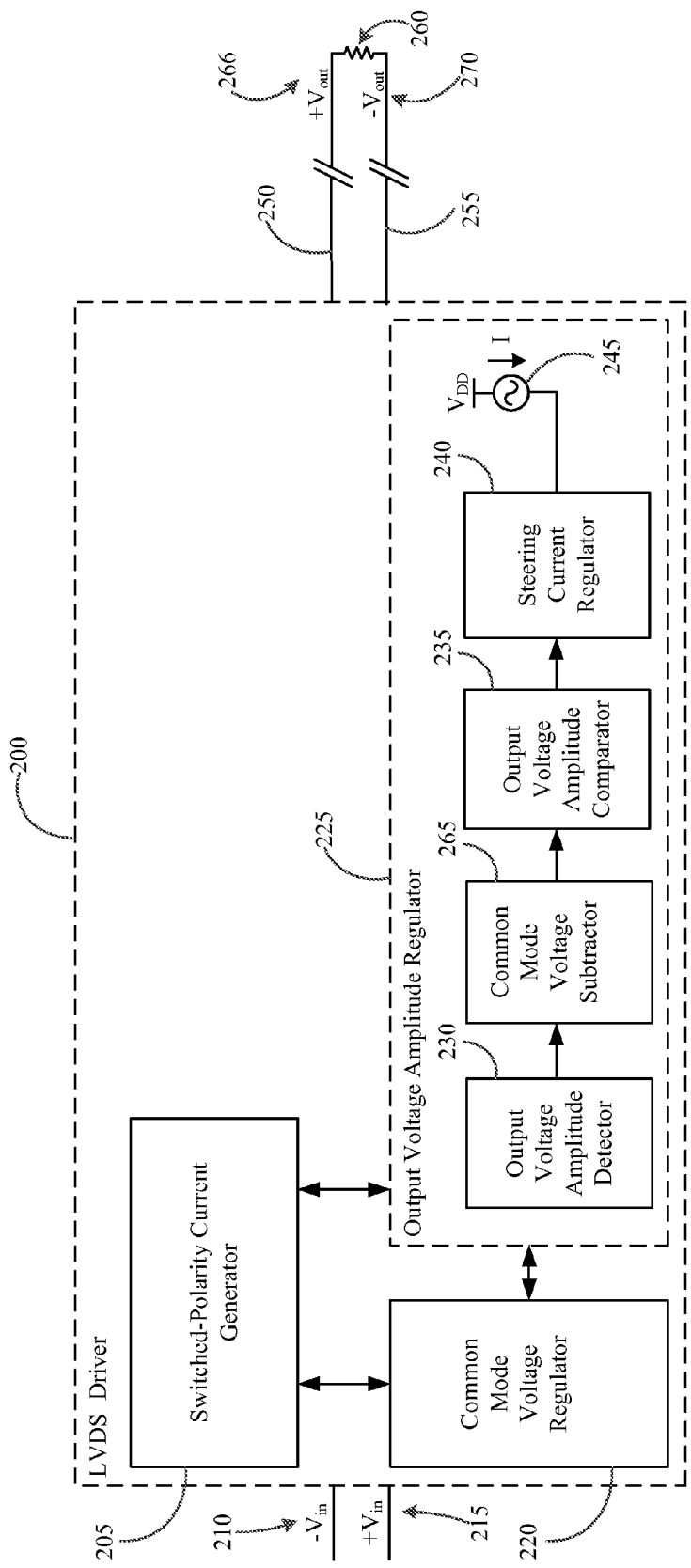
FIG. 2 is a block diagram of an LVDS driver having differential output voltage amplitude regulation, in accordance with an embodiment of the present invention.

With reference to FIG. 2, in an additional embodiment, the output voltage amplitude regulator 225 may include a common mode voltage subtractor 265. In this embodiment, an LVDS driver 200 includes a switched-polarity current generator 205, a common mode voltage regulator 220 and an output voltage amplitude regulator 225. The switched-polarity current generator 205 of the LVDS driver 200 is configured to receive a differential input signal 210, 215 from a voltage source and to provide a differential output signal 266, 270 through a pair of transmission lines 250, 255 and to a load 260. The switched-polarity current generator 205 behaves as a typical LVDS transmitter by operating to provide a current source with a switched polarity. The output current from the current generator 205 flows through the load resistance 260, thereby establishing the appropriate differential output voltage swing. The common mode voltage regulator 220 is coupled to the switched-polarity current generator 205 and is configured to regulate the common mode voltage of the differential output signal 266, 270. The common mode voltage regulator 220 may be a closed-loop control circuit that provides a feedback bias current to the switched-polarity current generator 205 based upon a reference voltage and an integrated resistor. The output voltage amplitude regulator 225 is coupled to the common model voltage regulator 220 and to the switched-polarity current generator 205 and is configured to regulate the amplitude of the differential output signal 266, 270 under varying PVT conditions and multiple load conditions.

The output voltage amplitude regulator 225 of the embodiment in FIG. 2 further includes an output voltage amplitude detector 230, a common mode voltage subtractor 265, an output voltage amplitude comparator 235 and a steering current regulator 240. The output voltage amplitude regulator 225 is configured to receive the differential output signal 266, 270 generated by the switched-polarity current generator 205 and to detect the output voltage amplitude of the differential output signal 266, 270. The common mode voltage subtractor 265 is coupled between the output voltage amplitude detector 230 and the output voltage amplitude comparator 235 and is configured to subtract the common mode voltage level provided by the common mode voltage regulator 220 from the output voltage amplitude detected by the output voltage amplitude detector 230 prior to comparing the output voltage amplitude to the reference voltage. The output voltage amplitude comparator 235 is coupled to the common mode voltage subtractor 265 and is configured to compare the output voltage amplitude of the differential output signal to a reference voltage after the common mode voltage subtractor 265 has subtracted the common mode voltage level provided by the common mode voltage regulator 220 from the output voltage amplitude detected by the output voltage amplitude detector 230. The steering current regulator 240 is coupled to the output voltage amplitude comparator 235 and to the common mode voltage regulator 220 and is configured to regulate the steering current 245 of the LVDS driver 200 based upon the comparison between the output voltage amplitude of the differential output and the reference voltage, thereby controlling the amplitude of the output voltage across the load 260.

Figure 3:
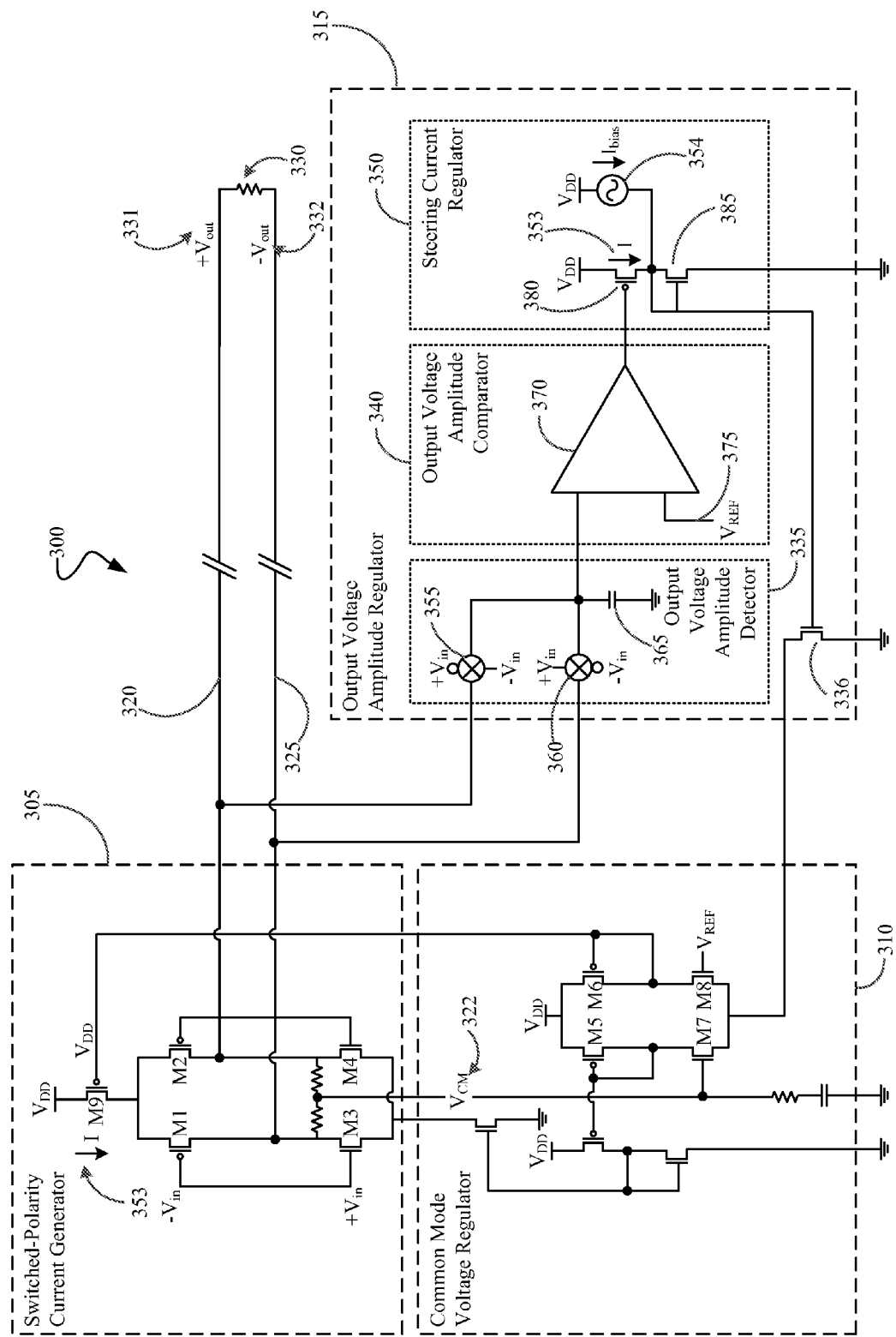
FIG. 3 is a diagrammatic view of an integrated circuit comprising an LVDS driver having differential output voltage amplitude regulation and associated supporting circuitry, in accordance with an embodiment of the present invention.

With reference to FIG. 3, exemplary circuit architecture for the switched-polarity current generator 305 of the LVDS driver 300 may include four MOS switches in a bridge configuration, M1-M4. In accordance with well-known LVDS circuit principles, transistors M1-M4 form the output signal switchbox with differential pair transistors M1 and M2 receiving the primary differential phase of the input signal and differential pair transistors M3 and M4 receiving the inverse differential of the input signal. Transistor M9 serves as a tail current source for the steering current 353 flowing between the positive power supply terminal $V_{DD}$ and the negative supply terminal $V_{SS}$/GND. In accordance with well-known LVDS circuit principles, when transistors M1 and M4 are turned on, transistors M2 and M3 are turned off and when transistors M2 and M3 are turned on, transistors M1 and M4 are turned off. Accordingly, the steering current 353 is steered through an external load resistor 330 to produce the differential output voltage 331, 332. While this circuitry is illustrated as being implemented using a complementary set of P-MOSFETS and N-MOSFETS, it is to be understood that similar circuitry can be implemented exclusively using P-MOSFETS or N-MOSFETS. This circuit architecture for the switched-polarity current generator 305 is exemplary in nature and various other circuit configurations are within the scope of the present invention.

With a nominal 100Ω load at the receiver, both the common mode voltage and the differential output voltage at the load should fall within the LVDS standard specifications over the full range of process, supply voltage and temperature (PVT) variations, wherein the differential output voltage is within a range 250 mV to 450 mV and the common mode voltage is within a range of 1.125V to 1.375V. In order to regulate the common mode voltage, the LVDS driver 300 includes a common mode voltage regulator 310. In accordance with well-know common mode voltage regulation techniques, the common mode voltage regulator 310 may be implemented as a simple low-power common mode feedback control in which the common mode output voltage 322 is sensed by means of a high resistive-divider and compared with a 1.25V reference voltage 324 by the differential amplifier M5-M8. A current mirror is then established by the fraction of the tail current flowing across M7 and M8, thereby regulating the common mode voltage to a level of 1.25V under varying PVT conditions. While this circuitry is illustrated as being implemented using a complementary set of P-MOSFETS and N-MOSFETS, it is to be understood that similar circuitry can be implemented exclusively using P-MOSFETS or N-MOSFETS. This circuit architecture for the common mode voltage regulator 310 is exemplary in nature and various other circuit configurations are within the scope of the present invention.

While the common voltage regulator 310 is effective in stabilizing the common mode voltage for the switched-polarity current generator 305 of the LVDS driver 300, it does not regulate the amplitude of the output voltage. The amplitude of the output voltage is affected by varying PVT conditions. Additionally, in the case of multiple loads coupled to the LVDS driver, the amplitude of the output voltage will be divided by the number of loads connected to the output of the LVDS driver. It order to regulate the amplitude of the output voltage, it is necessary to regulate the steering current 353 of the switched-polarity current generator 305. The output voltage amplitude regulator 315 of the present invention is effective in regulating the steering current 353 of the switched-polarity current generator 305, thereby regulating the amplitude of the differential output voltage 331, 332 at one or more loads 330 coupled to the LVDS driver 300.

As shown in FIG. 3, the output voltage amplitude regulator 315 includes an output voltage amplitude detector 335, an output voltage amplitude comparator 340 and a steering current regulator 350. The output voltage amplitude detector 335 may be implemented as a sample-and-hold circuit comprising a first switch 355 coupled to a first one of the differential output signal lines 320 and a second switch 360 coupled to a second one of the differential output signal lines 325. The sample-and-hold circuit further includes a capacitor coupled between an output of each of the switches 355 and 360 and ground. In this embodiment, the first switch 355 turns on when the differential output voltage 331 on line 320 is driven high and the second switch 360 turns on when the differential output voltage 332 on line 325 is driven high. As such, the first switch 355 samples a first output of the differential output signal when the first output is driving high and the second switch 360 samples a second output of the differential output signal when the second output is driving high. The output voltages sampled by both the first switch 355 and the second switch 360 are provided to the capacitor 365, alternating between the first switch 355 and the second switch 360. The sampled output voltage from the first switch 355 is held at the capacitor 365 to provide a first output voltage amplitude at an input of the output voltage amplitude comparator 340. The sampled output voltage from the second switch 360 is then held at the capacitor 365 to provide a second output voltage amplitude at an input of the output voltage amplitude comparator 340. In this way, the output voltage amplitude detector 335 samples the voltage output of each of the voltage outputs 331, 332 of the switched-polarity current generator 305 as they are driven high and provides either first output voltage amplitude from the first switch 355 or a second output voltage amplitude from the second switch 360 to the output voltage amplitude comparator 340. This circuit architecture for the output voltage amplitude detector 335 is exemplary in nature and various other circuit configurations are within the scope of the present invention.

In the embodiment of FIG. 3, the output voltage amplitude comparator 340 is configured to receive the sample-and-hold voltage output amplitude samples from the output voltage amplitude detector 335 and to compare the sampled output voltage amplitude to a reference voltage 375 utilizing an operational amplifier 370. In one embodiment, the reference voltage 375 may be a bandgap reference voltage, such as a 1.25V bandgap reference voltage. In an alternative embodiment, the reference voltage 375 may be provided by a digital-to-analog converter (DAC), thereby allowing the reference voltage to be arbitrarily set to a desired amplitude level. At the operational amplifier 370, the output voltage amplitude from the output voltage amplitude detector 335 is provide to a first input terminal of the operational amplifier 370 and the reference voltage is provided at a second input terminal of the operational amplifier 370. The output of the operational amplifier 370 is linearly proportional to the voltage difference between the first input terminal and the second input terminal. As such, the output voltage amplitude comparator 340 measures the difference between the sampled output voltage amplitude provided by the output voltage amplitude detector 335 and the reference voltage 375 and provides the measured difference at the output of the operational amplifier 370. The output of the operational amplifier 370 is provided as an input to the steering current regulator 350. The circuit architecture for the output voltage comparator 340 in this embodiment is exemplary in nature and various other circuit configurations are within the scope of the present invention.

The steering current regulator 350 regulates the steering current 353 of the LVDS driver 300 based upon the result of the difference between the sampled output voltage amplitude provided by the output voltage amplitude comparator 340 and the reference voltage 375. In a particular embodiment, the steering current regulator may include a first P-MOS transistor having a source node coupled to $V_{DD}$, a drain node coupled to an N-MOS transistor which has a source node coupled to the common mode voltage regulator 310, and a gate node coupled to the output of the comparator 370 of output voltage amplitude comparator 340. The steering current regulator 350 may further include an N-MOS transistor 385 having a source and a gate coupled to the drain of the P-MOS transistor 380 and a drain coupled to a ground node. The gate node of the N-MOS transistor 385 may further be coupled to the gate node of an output N-MOS transistor 336 that is positioned between the steering current regulator 350 and the common mode voltage regulator 310 and serves as an output transistor for the current mirror. The regulated steering current 353 is provided at the drain node of the P-MOS transistor 380. The steering current 353 is the current through the transistor 380 and is regulated by the transistor 380. In an additional embodiment, a DC bias current 354 may be provided in parallel with transistor 380 to set a minimum allowed current for the steering current regulator 350. By regulating the steering current 353, the output voltage amplitude regulator 315 is able to regulate the output voltage amplitude of the differential output signal 331, 332 across the load 330. As such, in accordance with the present invention, the amplitude of the output voltage of the differential signal when the output voltage is driven high is compared to a reference voltage to regulate the steering current of the LVDS driver 300, thereby regulating the output voltage amplitude of the LVDS driver 300. By regulating the output voltage amplitude of the LVDS driver 300, the amplitude of the output voltage of the differential output signal can be maintained at a desired level in spite of changes in process, supply voltage and temperature (PVT). Additionally, the output voltage amplitude differential output signal can be maintained at a desired level even when multiple loads are simultaneously coupled to the LVDS driver 300. The circuit architecture for the steering current regulator 350 in this embodiment is exemplary in nature and various other circuit configurations are within the scope of the present invention.

Figure 4:
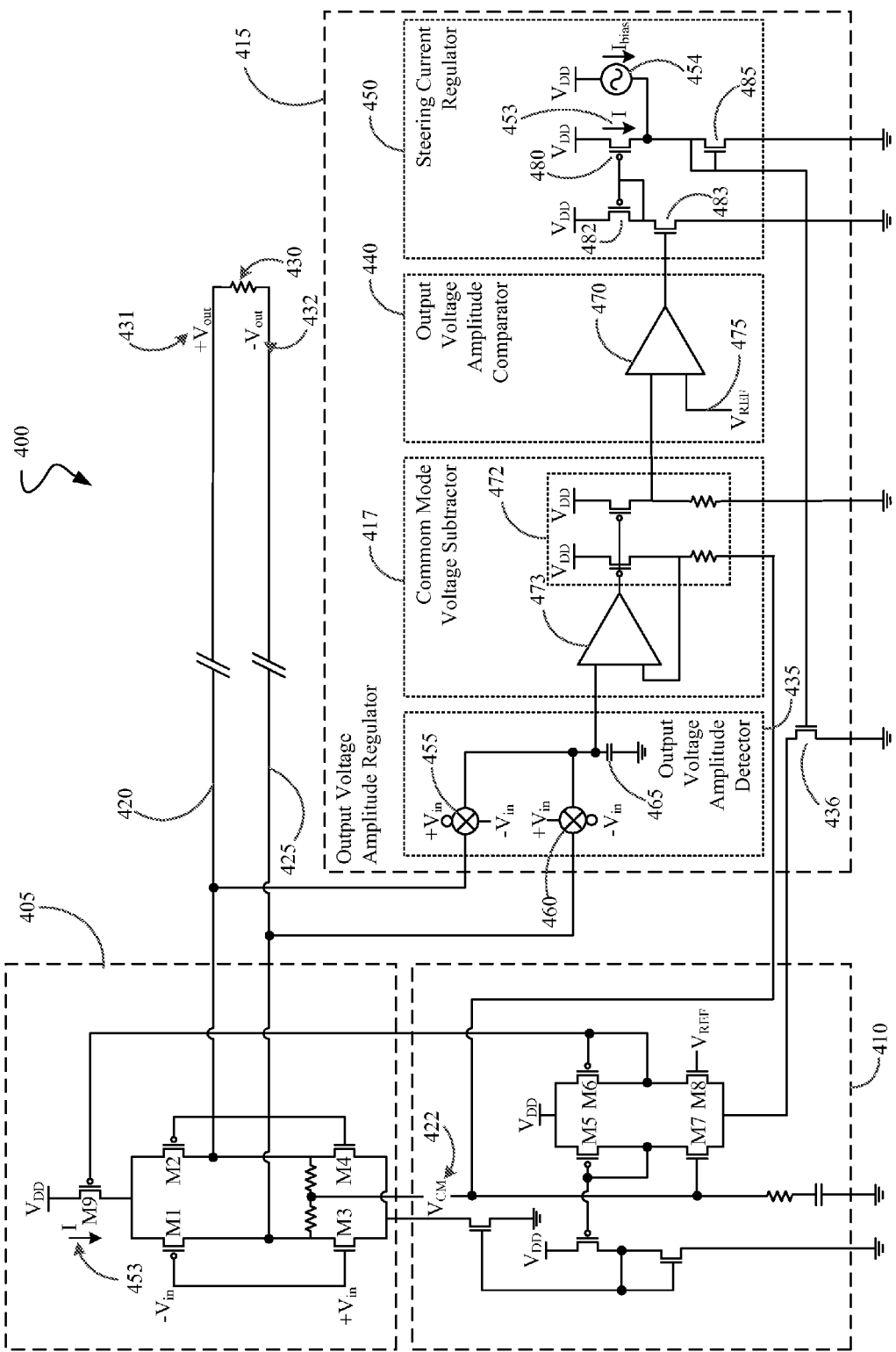
FIG. 4 is a diagrammatic view of an integrated circuit comprising an LVDS driver having differential output voltage amplitude regulation and associated supporting circuitry, in accordance with an embodiment of the present invention.

In the embodiment illustrated with reference to FIG. 3, the output voltage amplitude detected by the output voltage amplitude detector 335 is inclusive of the common mode voltage level. In an alternative embodiment, it may be desirable to subtract the common mode voltage from the detected output voltage amplitude prior to performing the comparison between the output voltage amplitude and the reference voltage. As such, in an additional embodiment, as shown in FIG. 4, a common mode voltage subtractor 417 may be added to the output voltage amplitude regulator 415. As shown with reference to FIG. 4, the output voltage amplitude regulator 415 includes an output voltage amplitude detector 435, a common mode voltage subtractor 417, an output voltage amplitude comparator 440 and a steering current regulator 450. The output voltage amplitude detector 435 may be implemented as a sample-and-hold circuit comprising a first switch 455 coupled to a first one of the differential output signal lines 420 and a second switch 460 coupled a second one of the differential output signal lines 425. The sample-and-hold circuit further includes a capacitor coupled between an output of each of the switches 455 and 460 and ground. In this embodiment, the first switch 455 turns on when the differential output voltage 431 on line 420 is driven high and the second switch 460 turns on when the differential output voltage 432 on line 425 is driven high. As such, the first switch 455 samples a first output of the differential output signal when the first output is driving high and the second switch 460 samples a second output of the differential output signal when the second output is driving high. The output voltages sampled by both the first switch 455 and the second switch 460 are provided to the capacitor 465, alternating between the first switch 455 and the second switch 460. The sampled output voltage from the first switch 455 is held at the capacitor 465 to provide a first output voltage amplitude at an input of the common mode voltage subtractor 417. The sampled output voltage from the second switch 460 is then held at the capacitor 465 to provide a second output voltage amplitude at an input of the common mode voltage subtractor 417. In this way, the common mode voltage subtractor 417 samples the voltage output high level of each of the voltage outputs 431, 432 of the switched-polarity current generator 405 as they are driven high and provides either first output voltage amplitude from the first switch 455 or a second output voltage amplitude from the second switch 460 to the output voltage amplitude comparator 440.

In the embodiment of FIG. 4, the common mode voltage subtractor 417 is coupled between the output voltage amplitude detector 435 and the output voltage amplitude comparator 440. The common mode voltage subtractor 417 may include a differential amplifier 473 having a first input coupled to the output voltage amplitude detector 435 and a second input coupled to a resistor divider network 472. The resistor divider network 472 may include a first transistor coupled in series with a first resistor between $V_{DD}$ and the common mode voltage from the common mode voltage regulator 410 and a second transistor coupled in series with a second transistor between $V_{DD}$ and a ground node. The common mode voltage subtractor 417 effectively reduces the output voltage amplitude detected by the output voltage amplitude detector 435 by an amount equal to the voltage level of the common mode voltage of the LVDS driver 400 that is regulated by the common mode voltage regulator 410. This circuit architecture for the common mode voltage subtractor 417 is exemplary in nature and various other circuit configurations are within the scope of the present invention.

In the embodiment of FIG. 4, the output voltage amplitude comparator 440 is configured to receive the sample-and-hold voltage output amplitude samples that have been reduced by the common mode voltage from the common mode voltage subtractor 435 and to compare the output voltage amplitude to a reference voltage 475 utilizing an operational amplifier 470. In one embodiment, the reference voltage 475 may be based on a bandgap reference voltage, such as a 1.25V bandgap reference voltage. In an alternative embodiment, the reference voltage 475 may be based upon by a digital-to-analog converter (DAC), thereby allowing the reference voltage to be arbitrarily set to a desired amplitude level. In either embodiment, the value of the reference voltage 475 is dependent upon the values of the resistors of the resistor divider network 472 of the common mode voltage subtractor 417. At the operational amplifier 470, the output voltage amplitude from the output voltage amplitude detector 435 is provide to a first input terminal of the operational amplifier 470 and the reference voltage is provided at a second input terminal of the operational amplifier 470. The output of the operational amplifier 470 is linearly proportional to the voltage difference between the first input terminal and the second input terminal. As such, the output voltage amplitude comparator 440 measures the difference between the sampled output voltage amplitude provided by the output voltage amplitude detector 435 and the reference voltage 475 and provides the measured difference at the output of the operational amplifier 470. The output of the output voltage amplitude comparator 440 is provided as an input to the steering current regulator 450.

The steering current 453 is the current through the transistor 480 and is regulated by the transistor 480. In an additional embodiment, a DC bias current 454 may be provided in parallel with transistor 480 to set a minimum allowed current for the steering current regulator 450. The steering current regulator 450 regulates the steering current of the LVDS driver 400 based upon the result of the comparison between the output voltage amplitude provided by the output voltage amplitude comparator 440 and the reference voltage 475. In a particular embodiment, the steering current regulator may include a first P-MOS transistor 480 having a source node coupled to $V_{DD}$, a drain node coupled to a first N-MOS transistor 485 having a source node coupled to the common mode voltage regulator 410. The first N-MOS transistor 485 may have a source and a gate coupled to the drain of the first P-MOS transistor 480 and a drain coupled to a ground node. The gate node of the N-MOS transistor 485 may further be coupled to the gate node of output N-MOS transistor 436 that is positioned between the steering current regulator 450 and the common mode voltage regulator 410 and serves as an output transistor for the current mirror. The gate node of the first P-MOS transistor may be coupled to the gate node of a second P-MOS transistor 482 and to a source node of a second N-MOS transistor 483. The source node of the second P-MOS transistor 482 may be coupled to $V_{DD}$ and the drain node of the second N-MOS transistor 483 may be coupled to a ground node. The gate node of the second N-MOS transistor 483 may be coupled to the output of the operational amplifier 470 of output voltage amplitude comparator 440. In this embodiment, the regulated steering current 453 is provided at the drain node of the P-MOS transistor 480. The output of the operational amplifier 470 is used to regulate the steering current 453 through the transistor network. By regulating the steering current 453, the output voltage amplitude regulator 415 is able to regulate the output voltage amplitude of the differential output signal 431, 432 across the load 430. As such, in accordance with the present invention, the amplitude of the output voltage of the differential signal when the output voltage is driven high is compared to a reference voltage to regulate the steering current of the LVDS driver 400, thereby regulating the output voltage amplitude of the LVDS driver 400. By regulating the output voltage amplitude of the LVDS driver 400, the amplitude of the output voltage can be maintained at a desired level in spite of changes in process, supply voltage and temperature (PVT). Additionally, the output voltage amplitude can be maintained at a desired level even when multiple loads are simultaneously coupled to the LVDS driver 400.

Figure 5:
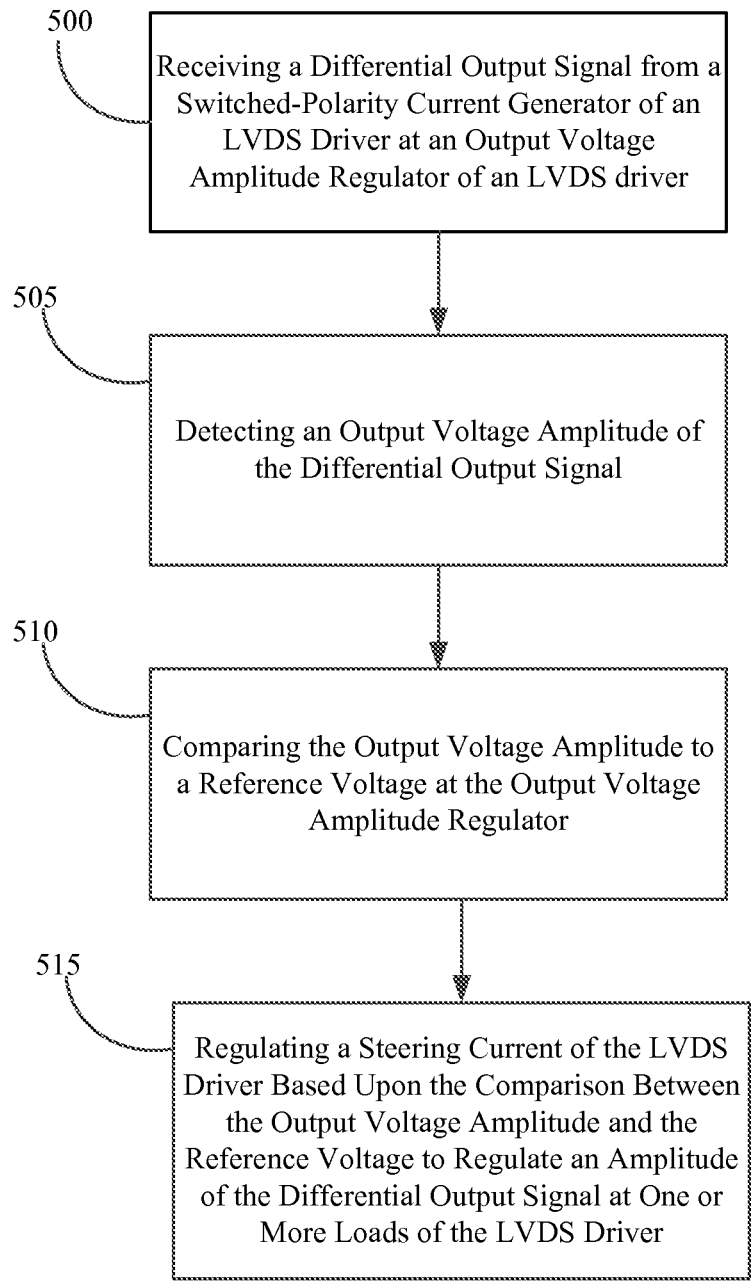
FIG. 5 is a flow diagram illustrating a method of regulating an output voltage amplitude of the differential signal of an LVDS driver, in accordance with an embodiment of the present invention.

FIG. 5 is a flow diagram illustrating a method for regulating an output voltage amplitude of an LVDS driver. The method includes receiving a differential output signal from a switched-polarity current generator of an LVDS driver at an output voltage amplitude regulator of the LVDS driver 500. With reference to FIG. 3, in one embodiment, the switched-polarity current generator 305 generates the differential output signal and the output voltage amplitude regulator 315 receives the differential output signal from the switch-polarity current generator 305.

After the receiving the differential output signal at the output voltage amplitude regulator, the method continues by detecting an output voltage amplitude of the differential output signal 505. With reference to FIG. 3, in one embodiment, the output voltage amplitude detector 335 of the output voltage amplitude regulator 315 detects the output voltage amplitude of the differential output signal.

Following the detection of the output voltage amplitude of the differential output signal, the method continues by comparing the output voltage amplitude to a reference voltage at the output voltage amplitude regulator 510. The reference voltage may be a bandgap reference voltage or a voltage provided by a digital-to-analog converter. With reference to FIG. 3, in one embodiment, the output voltage amplitude comparator 340 of the output voltage amplitude regulator 315 compares the output voltage amplitude to a reference voltage.

After the output voltage amplitude has been compared to the reference voltage, the method continues by regulating a steering current of the LVDS driver based upon the comparison between the output voltage amplitude and the reference voltage to regulate an amplitude of the differential output signal at one or more loads of the LVDS driver 515. With reference to FIG. 3, in one embodiment, the steering current regulator 350 of the output voltage amplitude regulator 315 regulates the steering current of the LVDS driver.

Accordingly, the present invention provides a low voltage differential signaling (LVDS) driver having differential output signal amplitude regulation. As such the differential output voltage provided by the LVDS driver of the present invention is substantially constant over varying process, temperature and supply voltage conditions and under multiple load conditions.

Exemplary embodiments of the invention have been described using CMOS technology. As would be appreciated by a person of ordinary skill in the art, a particular transistor can be replaced by various kinds of transistors with appropriate inversions of signals, orientations and/or voltages, as is necessary for the particular technology, without departing from the scope of the present invention.

In one embodiment, the LVDS driver 300 may be implemented in an integrated circuit as a single semiconductor die. Alternatively, the integrated circuit may include multiple semiconductor dies that are electrically coupled together such as, for example, a multi-chip module that is packaged in a single integrated circuit package.

In various embodiments, the system of the present invention may be implemented in a Field Programmable Gate Array (FPGA) or Application Specific Integrated Circuit (ASIC). As would be appreciated by one skilled in the art, various functions of circuit elements may also be implemented as processing steps in a software program. Such software may be employed in, for example, a digital signal processor, microcontroller or general-purpose computer.

For purposes of this description, it is understood that all circuit elements are powered from a voltage power domain and ground unless illustrated otherwise. Accordingly, all digital signals generally have voltages that range from approximately ground potential to that of the power domain.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. A method of regulating an output voltage amplitude of a low voltage differential signaling (LVDS) driver, the method comprising:
    receiving a differential output signal from a switched-polarity current generator of an LVDS driver at an output voltage amplitude regulator of an LVDS driver;
    detecting an output voltage amplitude of the differential output signal;
    detecting a common mode voltage of the differential output signal;
    subtracting the common mode voltage from the output voltage amplitude;
    comparing the output voltage amplitude to a reference voltage at the output voltage amplitude regulator after the subtracting the common mode voltage from the output voltage amplitude; and
    regulating a steering current of the LVDS driver based upon the comparison between the output voltage amplitude and the reference voltage to regulate an amplitude of the differential output signal at one or more loads of the LVDS driver.

2. The method of claim 1, further comprising, regulating the common mode voltage of the differential output signal.

3. A method of regulating an output voltage amplitude of a low voltage differential signaling (LVDS) driver, the method comprising:
    receiving a differential output signal from a switched-polarity current generator of an LVDS driver at an output voltage amplitude regulator of an LVDS driver;
    detecting an output voltage amplitude of the differential output signal by sampling a first output of the differential output signal when the first output is driving high, holding the first output at a capacitor to provide a first output voltage amplitude, sampling a second output of the differential output signal when the second output is driving high, and holding the second output at the capacitor to provide a second output voltage amplitude, comparing the output voltage amplitude to a reference voltage at the output voltage amplitude regulator; and regulating a steering current of the LVDS driver based upon the comparison between the output voltage amplitude and the reference voltage to regulate an amplitude of the differential output signal at one or more loads of the LVDS driver.

4. The method of claim 3, wherein comparing the output voltage amplitude to a reference voltage further comprises, comparing the first output voltage amplitude or the second output voltage amplitude to the reference voltage.

5. The method of claim 3, wherein the reference voltage is a bandgap reference voltage.

6. The method of claim 3, wherein the reference voltage is a voltage provided by a digital-to-analog converter.

7. A low voltage differential signaling (LVDS) driver comprising:
   a switched-polarity current generator configured to provide a differential output signal; and
   an output voltage amplitude regulator coupled to the switched-polarity current generator, the output voltage amplitude regulator configured to receive the differential output signal, to detect the output voltage amplitude of the differential output signal, to compare the output voltage amplitude to a reference voltage and to regulate a steering current of the LVDS driver based upon the comparison between the output voltage amplitude and the reference voltage to regulate an amplitude of the differential output signal; and
   a common mode voltage regulator coupled to the switched-polarity current generator and to the output voltage amplitude regulator, the common mode voltage regulator configured to regulate the common mode voltage of the switched-polarity current generator.

8. A low voltage differential signaling (LVDS) driver comprising:
   a switched-polarity current generator configured to provide a differential output signal; and
   an output voltage amplitude regulator coupled to the switched-polarity current generator, the output voltage amplitude regulator further including:
      an output voltage amplitude detector coupled to the switched-polarity current generator, the output voltage amplitude detector configured to detect the output voltage amplitude of the differential output signal from the switched-polarity current generator;
      an output voltage amplitude comparator coupled to the output voltage amplitude detector, the output voltage amplitude comparator configured to compare the output voltage amplitude to a reference voltage; and
      a steering current regulator coupled to the output voltage amplitude comparator, the steering current regulator configured to regulate the steering current of the LVDS driver based upon the comparison between the output voltage amplitude and the reference voltage to regulate an amplitude of the differential output signal.

9. The LVDS driver of claim 8, further comprising:
   a common mode voltage subtractor coupled to the common mode voltage regulator, to the output voltage amplitude detector and to the output voltage amplitude comparator, the common mode voltage subtractor configured to detect a common mode voltage of the differential output signal and to subtract the common mode voltage from the output voltage amplitude before providing the output voltage amplitude to the output voltage amplitude comparator.

10. The LVDS driver of claim 8, wherein the reference voltage is a bandgap reference voltage.

11. The LVDS driver of claim 8, wherein the reference voltage is a voltage provided by a digital-to-analog converter.

12. A low voltage differential signaling (LVDS) driver comprising:
   a switched-polarity current generator configured to provide a differential output signal; and
   an output voltage amplitude regulator coupled to the switched-polarity current generator, the output voltage amplitude regulator configured to receive the differential output signal, to detect the output voltage amplitude of the differential output signal, to compare the output voltage amplitude to a reference voltage and to regulate a steering current of the LVDS driver based upon the comparison between the output voltage amplitude and the reference voltage to regulate an amplitude of the differential output signal at one or more coupled loads, wherein the output voltage amplitude regulator includes an output voltage amplitude detector that includes a first switch configured to sample a first output of the differential output signal when the first output is driving high, a second switch configured to sample a second output of the differential output signal when the second output is driving high, and a capacitor coupled to the first switch and to the second switch, the capacitor configured to hold the first output to provide a first output voltage amplitude or to hold the second output to provide a second output voltage amplitude.

13. The LVDS driver of claim 12, wherein the output voltage amplitude comparator is configured to compare the first output voltage amplitude or the second output voltage amplitude to the reference voltage.

14. A low voltage differential signaling (LVDS) driver coupled to one or more loads, the LVDS driver further comprising:
   a switched-polarity current generator configured to provide a differential output signal at one or more loads;
   a common mode voltage regulator coupled to the switched-polarity current generator, the common mode voltage regulator configured to regulate the common mode voltage of the switched-polarity current generator;
   an output voltage amplitude detector coupled to the switched-polarity current generator, the output voltage amplitude detector configured to detect the output voltage amplitude of the differential output signal from the switched-polarity current generator;
   an output voltage amplitude comparator coupled to the output voltage amplitude detector, the output voltage amplitude comparator configured to compare the output voltage amplitude to a reference voltage; and
   a steering current regulator coupled to the output voltage amplitude comparator, the steering current regulator configured to regulate the steering current of the LVDS driver based upon the comparison between the output voltage amplitude and the reference voltage to regulate an amplitude of the differential output signal at the one or more loads of the LVDS driver.

15. The LVDS driver of claim 14, further comprising a common mode voltage subtractor coupled to the common mode voltage regulator, to the output voltage amplitude detector and to the output voltage amplitude comparator, the common mode voltage subtractor configured to detect a common mode voltage of the differential output signal and to subtract the common mode voltage from the output voltage amplitude before providing the output voltage amplitude to the output voltage amplitude comparator.

16. The LVDS driver of claim 14, wherein the reference voltage is a bandgap reference voltage.

17. The LVDS driver of claim 14, wherein the reference voltage is a voltage provided by a digital-to-analog converter.

* * * * *